United States Patent [19]

Fraise

[11] Patent Number: 4,516,271
[45] Date of Patent: May 7, 1985

[54] MICROWAVE MIXER WITH RECOVERY OF THE SUM FREQUENCY

[75] Inventor: Pierre Fraise, Paris, France

[73] Assignee: Thomson-CSF, Paris, France

[21] Appl. No.: 522,212

[22] Filed: Aug. 11, 1983

[30] Foreign Application Priority Data

Aug. 20, 1982 [FR] France .................... 82 14435

[51] Int. Cl.³ .................................... H04B 1/26
[52] U.S. Cl. ................................ 455/327; 455/328
[58] Field of Search ............... 455/325, 326, 327, 328, 455/330

[56] References Cited

U.S. PATENT DOCUMENTS

| | | | |
|---|---|---|---|
| 3,001,143 | 9/1961 | Bruck | 455/325 |
| 3,261,981 | 7/1966 | Harwood et al. | 455/325 |
| 3,652,940 | 3/1972 | Reiter et al. | 455/328 |
| 3,652,941 | 3/1972 | Neuf | 455/327 |
| 3,859,600 | 1/1975 | Craven et al. | 455/328 |
| 4,211,987 | 7/1980 | Pan | 333/230 |
| 4,219,777 | 8/1980 | Richardson | 455/328 |
| 4,270,224 | 5/1981 | Blondel et al. | 455/328 |

FOREIGN PATENT DOCUMENTS 1102221 3/1961 Fed. Rep. of Germany .

OTHER PUBLICATIONS

Technical Digest of IEEE International Electron Devices Meeting, E. J. Denlinger et al.–"High Performance Mixer Diode", col. 1, Lines 35–40, FIG. 2, Dec. 6–8, 1976, pp. 87–89.
Digest of Technical Papers of 1971 IEEE–GMTT International Microwave Symposium, May 16–19, 1971, pp. 16–17, New York (USA)–"An Integrated X-Band, Image and Sum Frequency Enhanced Mixer with 1GHz IF", p. 16, col. 1, Line 56–col. 2, Line 18.
IEEE Trans. on Consumer Electronics, vol. CE-27, No. 3, Aug. 1981, pp. 410–415, New York, (USA)–"An MDS Downconverter of Thick-Film MIC for 26GHz Pay TV"–Uwamo et al.–FIGS. 6, 7, 11.
Proceedings 1971 Euro. Microwave Conference, Aug. 23–28, 1971, Royal Swedish Academy of Engineering Sciences, pp. A11/5:1–A11/5:4, Stockholm(SE)–"Image Recovery Mixers"–Oxley et al., p. A11/5:1:3.1 Signal Filter.
"Microwave Low Noise Mixers with Image and Sum Frequency Enhancement"–Bates, Jul. 1978–Conference on Radio Receivers and Associated Systems, Southampton, England, pp. 317–322.
"An Integrated Circuit Balanced Mixer Image and Sum Enhanced"–Dickens et al., Mar. 1975–IEEE Trans. on Microwave Theory and Techniques, vol. MTT–23, No. 3, pp. 276–281.

*Primary Examiner*—Marc E. Bookbinder
*Attorney, Agent, or Firm*—Cushman, Darby & Cushman

[57] ABSTRACT

The mixer comprises a microelectronic circuit composed of one or a number of active electronic elements having a nonlinear characteristic and carried on a substrate, the elements being supplied by waveguide lines placed on the substrate. The microelectronic circuit is fixed within a closed casing and connected to terminals placed on the casing in order to mix an incident wave S having a frequency $F_S$ applied to a first terminal of the casing with a mixing wave OL having a frequency $F_L$ applied to a second terminal of the casing and in order to restitute a mixed wave OR having a frequency $F_O$ on a third terminal. The cavity formed by the internal space of the casing is tuned to a "sum" frequency representing the sum of the frequency of the mixing wave $F_L$ and of the frequency of the incident wave $F_S$.

10 Claims, 4 Drawing Figures

U.S. Patent May 7, 1985 4,516,271
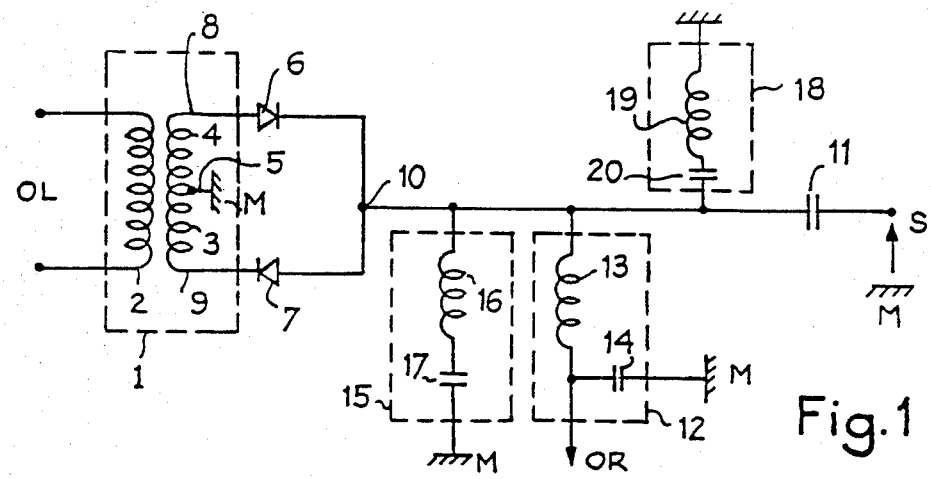
Fig.1
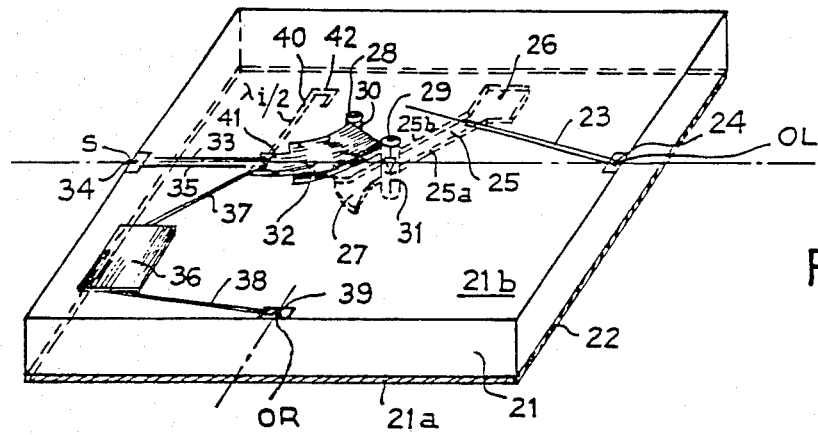
Fig.2
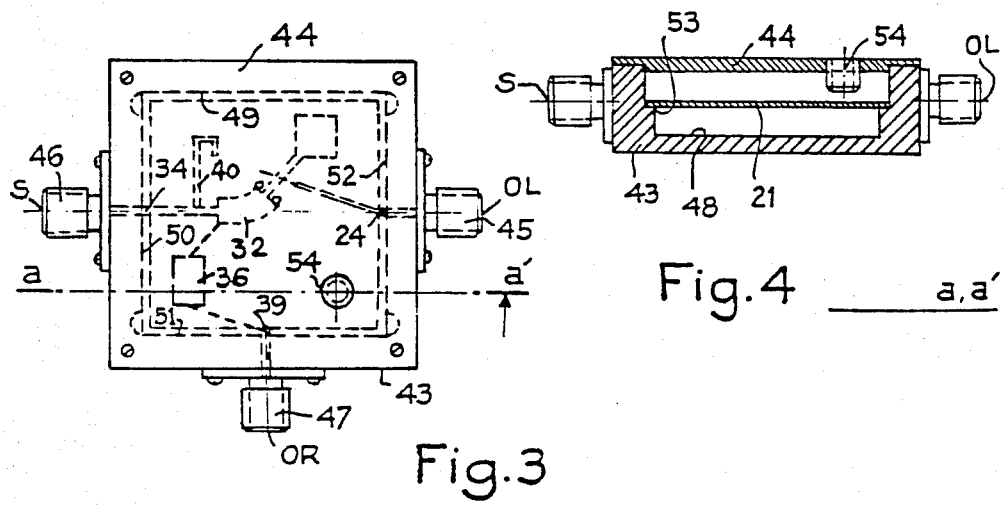
Fig.3
Fig.4

MICROWAVE MIXER WITH RECOVERY OF THE SUM FREQUENCY

BACKGROUND OF THE INVENTION

The invention relates to microwave mixers which consist of active nonlinear electronic elements of the type comprising diodes or transistors and which are more particularly applicable to the field of telecommunication receivers.

The term mixer is understood to mean an electronic device for mixing two periodic signals having different frequencies in order to deliver at its output a single signal, the frequency spectrum of which contains at least one frequency equal to the sum or to the difference of the frequencies of the two signals applied to the mixer, the difference frequency being commonly referred-to as an intermediate frequency.

A basic problem to be solved when it is sought to construct a mixer lies in the need to achieve maximum reduction of conversion losses. Conversion losses correspond to the difference, usually measured in decibels, between the power available at the input of the mixer and the power available at its output.

In theory, conversion losses could be zero if the output were perfectly adapted to the frequencies of the spectral lines of the output signal of the mixer and if all the powers of the nonessential lines of the spectrum were recovered.

In practice, however, it is impossible to control all the terminal impedances of a mixer in respect of each frequency. In consequence, conversion losses are never zero and the higher the losses, the more they produce a harmful effect on the sensitivity of the receiver which is coupled to the output.

In order to reduce conversion losses, one known method consists in placing on the signal access of the mixer band-stop filters tuned to predetermined frequencies of the spectrum of the output signal in order to reflect from the nonlinear electronic elements the corresponding lines of the mixed output signal and in order to obtain by further mixing with other preferential frequencies of the spectrum signal components in phase with and having the same frequency as the intermediate-frequency signal $F_O$ obtained by direct mixing.

By way of example, it is already a known practice to fabricate mixers of the band-stop filter type in the form of microcircuits. These mixers are formed by waveguides or slotted lines deposited by metallization on a substrate for recovering and reflecting the image frequency $F_I$ at the level of the nonlinear electronic elements of the mixer. This image frequency $F_I$ is symmetrical with the frequency $F_S$ of the signal applied to one input of the mixer with respect to the frequency of the mixing signal $F_L$ applied to the other input. The image frequency $F_I = 2F_L - F_S$ produced by the nonlinear electronic elements is reflected from these latter by the band-stop filter and further mixing of the image frequency $F_I$ with the frequency of the mixing signal produces a frequency $F_L - F_I = F_L - (2F_L - F_S) = F_S - F_L = F_O$ which is the same as the intermediate frequency obtained by direct mixing of the frequencies, namely the incident frequency $F_S$ and the mixing frequency $F_L$. Provided that the corresponding signal obtained is in phase with the intermediate-frequency signal obtained by direct mixing, these devices make it possible to obtain an increase in output amplitude of the intermediate-frequency signal $F_O$ and consequently a reduction in conversion losses in accordance with the desired objective.

Similarly, another expedient which could be considered with a view to reducing conversion losses would consist in reflecting the "sum" frequency resulting from direct addition by the mixer of the input frequencies $(F_L + F_S)$ towards the nonlinear electronic elements, this being also achieved by means of a band-stop filter tuned to the "sum" frequency. Mixing of the frequency $F_L + F_S$ with the double frequency $2F_L$ of the mixing signal also results, in this case, in an intermediate frequency $F_O$ in accordance with the operation:

$$F_O = (F_L + F_S) - 2F_L = F_S - F_L$$

On condition that the signal having a frequency $F_O$ and obtained as a result of the operation stated above is in phase with the intermediate-frequency signal, an additional reduction in conversion losses is necessarily obtained.

Unfortunately, in practice, control of the "sum" frequency $F_S + F_L$ cannot be obtained by means of techniques for the fabrication of waveguides in a microcircuit by reason of the various parasitic effects arising from the appearance of surface waves, from dispersion of the microwave-strip or slotted-line waveguides employed and from resonance effects produced by the casing and cover containing the electronic circuits of the mixer. These difficulties arise especially from the fact that the "sum" frequency is located at approximately double the frequency of the signal applied to the input of the mixer since, as a rule, the intermediate-frequency signal has a frequency $F_O$ which is well below the frequency $F_S$ of the signal applied to the input of the mixer.

SUMMARY OF THE INVENTION

The aim of the present invention is to overcome the disadvantages mentioned in the foregoing by constructing a mixer which permits recovery of the "sum" frequency at the level of the nonlinear active elements in order to achieve a corresponding reduction in conversion losses by making profitable use of the resonance phenomena which are usually considered as parasitic phenomena and are consequently undesirable.

To this end, the invention is directed to a microwave mixer comprising a microelectronic circuit composed of at least one active electronic element having a nonlinear characteristic and carried on a substrate, said elements being supplied by waveguide lines placed on the substrate. The microelectronic circuit is fixed within a closed casing and connected to terminals placed on the casing in order to mix an incident wave S having a frequency $F_S$ applied to a first terminal of the casing with a mixing wave OL having a frequency $F_L$ applied to a second terminal of the casing and in order to restitute a mixed wave having a frequency $F_O$ on a third terminal. The invention is distinguished by the fact that the cavity formed by the internal space of the casing is tuned to a "sum" frequency representing the sum of the frequency of the mixing wave $F_L$ and of the frequency of the incident wave $F_S$.

BRIEF DESCRIPTION OF THE DRAWINGS

FIG. 1 is a schematic circuit diagram corresponding to the microwave mixer in accordance with the invention.

FIG. 2 illustrates one embodiment of the circuit shown in FIG. 1 and produced in accordance with the technique of fabrication of waveguides and slotted lines by metallization deposition of strips on a substrate.

FIG. 3 is a top view of the mixer circuit of FIG. 2 within a casing closed by a cover.

FIG. 4 is a sectional view taken along line a-a' of the mixer shown in FIG. 3.

DETAILED DESCRIPTION OF THE INVENTION

As shown in the schematic diagram of FIG. 1, the mixer is constituted by a transformer 1 comprising a primary winding 2, two secondary half-windings 3 and 4 connected together at one end so as to form a center tap 5. Two diodes 6 and 7 are mounted in series between each end remote from the center tap 5 of the windings 3 and 4. The cathode of one diode 6 is connected to the anode of the other diode 7 in order to form a common node or connection point 10. The incident signal S to be mixed is applied by an external signal source (not shown) between the ground line M of the circuit and the common node 10 via a capacitor 11. The mixing signal OL is applied to the terminals of the primary winding 2 of the transformer 1 by an external local oscillator (not shown). The mixed signal OR is obtained at the output of a low-pass filter 12, the input of which is connected to the common node 10 providing a connection between the two diodes 6 and 7. Said low-pass filter is constituted by an inductance coil 13, one end of which is connected to the common node 10 whilst the other end constitutes the output of the mixer circuit and is connected to the ground line M via a capacitor 14. A band-stop filter 15 tuned to the image frequency $F_I = 2F_L - F_S$ produced by the diodes and representing the difference between twice the frequency of the local oscillator and the frequency of the applied signal is placed between the ground line M and the common node 10 of the diodes 6 and 7 in such a manner as to reflect the image frequency in the direction of the two diodes 6 and 7. In consequence a further mixing operation can thus be carried out with the frequency $F_L$ of the local oscillator in order to obtain an intermediate frequency $F_O$ equal to the frequency obtained by direct mixing of the frequencies $F_S$ of the applied signal and $F_L$ of the local oscillator and thus to reduce the conversion losses. Similarly, a band-stop filter 18 is placed between the connecting point or node which is common to the two diodes 10 and ground in order to reflect the "sum" frequency towards the two diodes 6 and 7 and to obtain a frequency component $F_O$ by mixing the "sum" frequency $F_S + F_L$ with the frequency $2F_L$ which is double the frequency of the local oscillator, both frequencies being generated by the diodes. The aforesaid frequency component $F_O$ is equal to the frequency obtained by direct mixing of the frequency $F_S$ of the signal applied to the input of the mixer with the frequency $F_L$ of the local oscillator. Under these conditions, the band-stop filter 18 makes it possible to reduce conversion losses in the same manner as the band-stop filter 15.

FIGS. 2 to 4 illustrate one embodiment of the mixer in accordance with the invention as shown in the schematic circuit diagram of FIG. 1. The mixer comprises a substrate 21 having two flat rectangular faces 21a and 21b which are parallel to each other and spaced at a distance of a few tenths of a millimeter. Said substrate is formed by a material having high permittivity such as magnesium titanate, alumina or teflon glass. A thin film of conductive material 22 is deposited by metallization on the first face 21a. A conductor 23 deposited by metallization of a strip on the face 21b is connected at one end to a terminal 24 placed against one edge of the face 21b. The other free end of said conductor is placed directly opposite to a slotted line 25 formed by etching or like means in the metallized layer 22. The slotted line 25 and the conductor 23 have approximately perpendicular directions. The slotted line 25 has two parallel internal sides 25a and 25b and has a first enlarged end terminating in a flared-out portion 26 and a second enlarged end terminating in a flared-out portion 27. The slotted line 25 and the conductor 23 are also arranged so as to ensure that the first end of the slotted line 25 is located opposite to the second end of the conductor 23. Bores 28 and 29 extending right through the substrate 21 are formed at the level of the second end of the slotted line 25 in proximity respectively to the sides 25a and 25b. Diodes 30 and 31 are mounted in top-to-tail relation within the bores 28 and 29 respectively. The cathode of the diode 31 is connected to the side 25a of the slotted line and the anode of the diode 30 is connected to the side 25b of the slotted line. The other ends of the diodes 30 and 31 are connected to one side of a plate 32 of approximately rectangular shape. That side of the plate 32 which is remote from the points of connection of the diodes 30 and 31 is joined to a first end of a conductor 33 deposited by metallization of a strip on the face 21b. The other end of said conductor 33 is left free opposite to a connection terminal 34 located on the face 21b at the edge opposite to the edge on which the connection terminal 24 is placed. The terminal 34 is connected to a first end of a conductor 35 which is deposited by metallization of a strip on the face 21b of the substrate whilst the other end of the conductor 35 is left free. The conductors 33 and 35 are so arranged as to have approximately parallel directions. A plate 36 of approximately rectangular shape is deposited by metallization on the face 21b of the substrate, a first side of the plate 36 being connected to a first end of a conductor 37 which is deposited by metallization of a strip on the face 21b of the substrate. The other end of the conductor 37 is connected to the plate 32 at the first end of the conductor 33. The side opposite to the first side of the plate 36 is connected to a first end of a conductor 38 which is deposited by metallization of a strip on the face 21b. The other end of the conductor 38 is connected to a terminal 39 placed on the face 21b of the substrate. A slotted line 40 is formed in the metal layer 22 in a direction approximately perpendicular to the directions of the conductors 33 and 35. A first end of the slotted line 40 is placed directly opposite to the common point of connection of the conductors 33, 37 to the plate 32. The other end 42 of the slotted line 40 is bent-back, thus permitting a reduction in dimensions of the substrate 21.

The operation of the mixer shown in FIG. 2 is as follows. The electric field of the wave of the signal OL produced by the local oscillator which is external to the mixer is applied between the terminal 24 and the metal layer 22 and propagates in the direction of the diodes 30 and 31 via the slotted line 25 which is coupled to the conductor 23 at the first end of said line, said conductor being connected directly to the terminal 24. The slotted line 25 and the conductor 23 perform the function of the transformer 1 shown in FIG. 1 and the sides 25a and 25b of the slotted line 25 vibrate in phase opposition at the point of connection of the diodes 30 and 31. The plate 32 performs the function of the connection point 10 or node of FIG. 1 and applies the electric field produced by the wave of the mixer input signal S, which is applied to the connection terminal 34, at the ends of the diodes 30 and 31 which are connected to the plate 32 via the capacitor formed by the parallel conductors 33 and 35. The plate 36 and the conductors 37 and 38 perform the function of the low-pass filter 12 of FIG. 1. The wave of the mixed signal OR of intermediate frequency $F_O$ is obtained on the terminal 39. The slotted line 40 has a length corresponding to the half-wavelength of the image frequency produced by the diodes and thus constitutes the band-stop filter 15 of FIG. 1. The band-stop filter 18 of FIG. 1 is not constructed directly on the substrate 21 and forms part of the device shown in FIGS. 3 and 4. These figures represent the circuit of the mixer of FIG. 2 which is mounted within a casing 43 closed by a cover 44. The casing 44 has the shape of a right-angled parallelepiped and is provided with three coaxial connectors 45, 46 and 47. The connector 45 serves to establish a connection between the terminal 24 of the substrate 21 and an external coaxial cable (not shown in the diagram) for transmitting the wave of the signal OL delivered by the local oscillator. The connector 46 serves to establish a connection between the terminal 34 of the substrate and an external coaxial cable (not shown) which has the function of transmitting the wave of the incident signal S. The connector 47 serves to establish a connection between the terminal 39 and an external coaxial cable (not shown) which transmits the wave of the signal OR delivered by the mixer. As shown in FIG. 4, the casing 43 is also provided with a bottom wall 48 delimited by the walls 49 to 52 on which is formed a projecting ledge 53 for maintaining the substrate 21 within the casing 43 in a direction parallel to the bottom wall 48. The cover 44 is fitted with a screw 54 which passes right through said cover and projects into the interior of the casing. The height of the projecting portion of the screw 54 is adjusted so as to cause the cavity of the casing formed by the cover 44, the bottom wall 48 and the walls 49 to 52 to enter into resonance at a frequency corresponding to the "sum" resonance frequency of the band-stop filter 18 of FIG. 1. Power is supplied to the cavity by the microcircuit elements themselves which radiate the "sum" frequency. In order to ensure that the operation of the mixer is not disturbed, the screw 54 is placed opposite to a portion of the substrate 21 which is located at a sufficient distance from the active circuit of the mixer.

As will readily be understood, the invention is not limited to the mixer described in the foregoing and is equally applicable to other alternative forms of construction in which it is possible in particular to adopt other shapes of cavities such as a cylindrical shape, for example. Tuning of the cavity to the "sum" frequency can also be performed by means which are equivalent to those described in the foregoing and are not necessarily fixed by means of the cover of the casing.

What is claimed is:

1. A microwave mixer comprising:
   a microelectronic circuit having at least one electronic element with a nonlinear characteristic,
   a substrate for supporting said circuit,
   a plurality of striplines coupled to said at least one element supported by said substrate,
   a closed casing surrounding said circuit and forming an internal cavity thereby, said casing having thereon first, second and third terminals,
   said first terminal accepting an incident wave of frequency Fs, said second terminal accepting a mixing wave of frequency $F_L$ and said third terminal providing a mixed output wave having a frequency Fo,
   tuning means coupled to said casing to tune said internal cavity to a sum frequency $Fs+F_L$ representing the sum of the frequency of the mixing wave $F_L$ and of the frequency of the incident wave Fs.

2. A mixer according to claim 1, wherein the casing is closed by a cover, said tuning means including an element projecting through a face of said cover.

3. A mixer according to claim 2, wherein the height of the projecting element above the face of the cover is adjustable.

4. A mixer according to claim 3, wherein the projecting element consists of a screw which extends right through the cover.

5. A mixer according to claim 4, wherein the projecting element is located within a portion of the cavity at a sufficient distance from the striplines supported on the substrate.

6. A mixer according to claim 5, wherein the substrate has an approximately flat shape.

7. A mixer according to claim 6, wherein the cover is parallel to the approximately flat shaped substrate.

8. A mixer according to claim 7, wherein the cavity is parallelepipedal.

9. A mixer according to claim 7, wherein the cavity is cylindrical.

10. A mixer according to claim 1, wherein said mixer also comprises means supported by the substrate for recovering the image frequency $F_I$ which is equal to twice the frequency $F_L$ of the mixing wave minus by the frequency $F_S$ of the incident wave in order to reflect the image frequency from the at least one electronic element having a nonlinear characteristic.

* * * * *